(12) United States Patent
Kuenemund

(10) Patent No.: US 9,431,398 B2
(45) Date of Patent: Aug. 30, 2016

(54) SEMICONDUCTOR CHIP HAVING A CIRCUIT WITH CROSS-COUPLED TRANSISTORS TO THWART REVERSE ENGINEERING

(71) Applicant: Infineon Technologies AG, Neubiberg (DE)

(72) Inventor: Thomas Kuenemund, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 66 days.

(21) Appl. No.: 14/262,830

(22) Filed: Apr. 28, 2014

(65) Prior Publication Data

US 2015/0311202 A1     Oct. 29, 2015

(51) Int. Cl.
| H01L 23/528 | (2006.01) |
| H01L 27/092 | (2006.01) |
| H01L 23/00 | (2006.01) |

(52) U.S. Cl.
CPC ........... *H01L 27/092* (2013.01); *H01L 23/528* (2013.01); *H01L 23/576* (2013.01); *H01L 2924/0002* (2013.01)

(58) Field of Classification Search
CPC . H01L 23/528; H01L 23/576; H01L 27/092; H01L 27/1104
USPC ........................................................ 257/369
See application file for complete search history.

(56) References Cited

U.S. PATENT DOCUMENTS

| 3,849,673 A | 11/1974 | Koo |
| 5,159,260 A | 10/1992 | Yoh et al. |
| 6,005,797 A * | 12/1999 | Porter et al. ........ H01L 27/1104 257/370 |
| 7,249,109 B1 | 7/2007 | Silverbrook et al. |
| 7,916,517 B2 | 3/2011 | Kuenemund |
| 8,434,046 B2 | 4/2013 | Marinet |
| 9,070,439 B2 | 6/2015 | Gammel et al. |
| 2004/0150052 A1 | 8/2004 | Riccardi et al. |

OTHER PUBLICATIONS

Jeyavijayan Rajendran, Michael Sam, Ozgur Sinanoglu, Ramesh Karri: Security Analysis of Integrated Circuit Camouflaging, CCS'13, Nov. 4-8, 2013, ACM, Berlin, Germany, pp. 709-720.
Randy Torrance: The state-of-the-art in Semiconductor Reverse Engineering at Chipworks, Chipworks, Sep. 9, 2009, Ottawa, Canada, 72 pages.
Circuit Camouflage Technology, SMI IP Protection and Anti-Tamper Technologies, SypherMedia Library, Version 1.9.8j, Mar. 2012, SypherMedia International, California, USA, 6 pages.

* cited by examiner

*Primary Examiner* — Marcos D Pizarro

(57) ABSTRACT

According to one embodiment, a chip has a circuit with at least one p channel field effect transistor (FET); at least one n channel FET; a first and a second power supply terminal; wherein the n channel FET, if supplied with the upper supply potential at its gate, supplies the lower supply potential to the gate of the p channel FET; and the p channel FET, if supplied with the lower supply potential at its gate, supplies the upper supply potential to the gate of the n channel FET; wherein the logic state of the gate of the p channel FET and of the n channel FET can only be changed by at least one of the first and second supply voltage to the circuit; and a connection coupled to the gate of the p channel FET or the n channel FET and a further component of the semiconductor chip.

12 Claims, 12 Drawing Sheets

XNOR: Z = NAND( NAND(*A1*, *A0*), OR(*A1*, *A0*))

SEMICONDUCTOR CHIP HAVING A CIRCUIT WITH CROSS-COUPLED TRANSISTORS TO THWART REVERSE ENGINEERING

TECHNICAL FIELD

The present disclosure relates to semiconductor chips.

BACKGROUND

Reverse engineering (RE) of integrated circuits (ICs) can be considered as one of the most serious threats to semiconductor industry, since it may be misused by an attacker to steal and/or pirate a circuit design. An attacker who successfully reverse engineers an integrated circuit can fabricate and sell a similar, i.e. cloned, circuit and illegally sell and reveal the design. Therefore concepts and techniques that thwart reverse engineering of integrated circuits are desirable.

SUMMARY

According to one embodiment, a semiconductor chip is provided including a circuit including at least one p channel field effect transistor; at least one n channel field effect transistor; a first power supply terminal configured to receive a first supply voltage with an upper supply potential; and a second power supply terminal configured to receive a second supply voltage with a lower supply potential; wherein the at least one p channel field effect transistor and the at least one n channel field effect transistor are connected such that the at least one n channel field effect transistor, if supplied with the upper supply potential at its gate, supplies the lower supply potential to the gate of the at least one p channel field effect transistor; and the at least one p channel field effect transistor, if supplied with the lower supply potential at its gate, supplies the upper supply potential to the gate of the at least one n channel field effect transistor; wherein the circuit is configured such that the logic state of the gate of the at least one p channel field effect transistor and the logic state of the gate of the at least one n channel field effect transistor can only be changed by changing a supply of at least one of the first supply voltage and the second supply voltage to the circuit; and wherein the semiconductor chip further includes a connection coupled to the gate of the at least one p channel field effect transistor or the gate of the at least one n channel field effect transistor and a further component of the semiconductor chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Reverse engineering can be hindered by deploying camouflage circuits. However, these typically require process technology extensions like doping profile modifications, faked contacts or vias and/or entail significantly increased area and energy consumption. Thus, these measures are often too expensive for mass products, e.g. in terms of license fees, silicon area or energy consumption.

In the following, a semiconductor chip is described with an increased necessary effort for a successful reverse engineering of the semiconductor chip. In the following, the term "semiconductor chip" is used to be equivalent with the term "integrated circuit".

Figure 1:
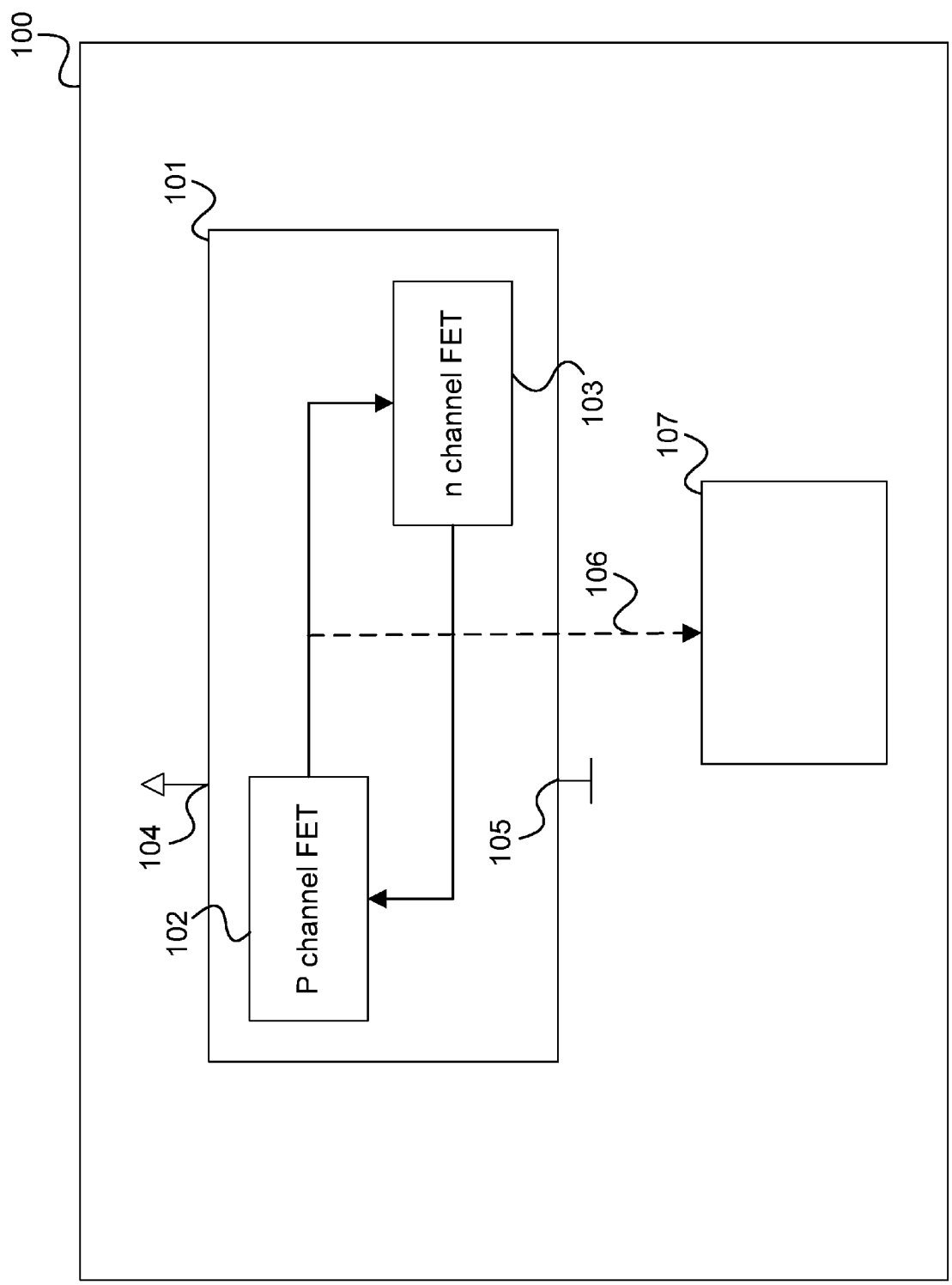
FIG. 1 shows a semiconductor chip according to an embodiment.

FIG. 1 shows a semiconductor chip 100 according to an embodiment.

The semiconductor chip 100 includes a circuit 101 including at least one p channel field effect transistor 102, at least one n channel field effect transistor 103, a first power supply terminal 104 configured to receive a first supply voltage with an upper supply potential (e.g. VDD) and a second power supply terminal 105 configured to receive a second supply voltage with a lower supply potential (e.g. VSS).

The at least one p channel field effect transistor 102 and the at least one n channel field effect transistor 103 are connected such that the at least one n channel field effect transistor 103, if supplied with the upper supply potential at its gate, supplies the lower supply potential to the gate of the at least one p channel field effect transistor 102 and the at least one p channel field effect transistor 102, if supplied with the lower supply potential at its gate, supplies the upper supply potential to the gate of the at least one n channel field effect transistor 103.

The circuit 101 is configured such that the logic state of the gate of the at least one p channel field effect transistor 102 and the logic state of the gate of the at least one n channel field effect transistor 103 can only be changed by changing a supply of at least one of the first supply voltage and the second supply voltage to the circuit 101.

The semiconductor chip 100 further includes a connection 106 coupled to the gate of the at least one p channel field effect transistor 102 or the gate of the at least one n channel field effect transistor 103 and a further component 107 of the semiconductor chip 100.

According to one embodiment, in other words, a circuit is provided on a semiconductor chip with two cross-coupled transistors which switch themselves on, wherein the potential at at least one of the cross-couplings is output from the circuit and supplied to further components of the semiconductor chip. One or more such circuits may be provided in the semiconductor chip to make reverse engineering more difficult.

The circuit 100 being configured such that the logic state of the gate of the at least one p channel field effect transistor and the logic state of the gate of the at least one n channel field effect transistor can only be changed by changing a supply of at least one of the first supply voltage and the second supply voltage to the circuit may be understood as the circuit being free from a control input for changing the logic state of the gate of the p channel field effect transistor and free from a control input for changing the logic state of the gate of the n channel field effect transistor. It may also be understood as the circuit being configured such that the logic state of the gate of the p channel field effect transistor and the logic state of the gate of the n channel field effect transistor cannot be changed by an external control signal to the circuit.

According to one embodiment, in other words, a TIE-Cell approach for IC camouflaging is used (which is also referred to as TIE-Cell camouflage concept or approach) which can be seen to be based on HC-TIE FILLER cells. Such a filler cell, which may for example be used to provide a certain capacity between two supply lines, includes cross-coupled transistors, e.g. pMOS (p channel metal oxide semiconductor) and nMOS (n channel MOS) field effect transistors (MOS) which enable (i.e. switch on) each other. For example, filler cells with "High Capacitance (HC) per unit area" may be used for semi-custom circuit implementation in order to resolve routing conflicts during the Place&Route part of the design flow.

According to one embodiment, the connection is configured to supply the logic state of the gate of the at least one p channel field effect transistor or the logic state of the gate of the at least one n channel field effect transistor to the further component of the semiconductor chip.

The further component of the semiconductor chip is for example a (logic) gate.

The further component of the semiconductor chip may be a dummy gate or a metal fill structure.

According to one embodiment, the circuit is a gate and includes the further component.

For example, the further component is another field effect transistor.

According to one embodiment, the at least one n channel field effect transistor or the at least one p channel field effect transistor is coupled between the first power supply terminal or the second power supply terminal and the other field effect transistor.

According to one embodiment, the semiconductor chip includes a first connection coupled to the gate of the at least one p channel field effect transistor and a first further component of the semiconductor chip and a second connection coupled to the gate of the at least one n channel field effect transistor and a second further component of the semiconductor chip. In other words, the logic states of both gates may be forwarded to other components of the semiconductor chip.

According to one embodiment the circuit includes a plurality of p channel field effect transistors; wherein the p channel field effect transistors and the at least one n channel field effect transistor are connected such that the at least one n channel field effect transistor, if supplied with a upper supply potential at its gate, supplies the lower supply potential to the gates of the p channel field effect transistors; and the p channel field effect transistors, if supplied with the lower supply potential at their gates, supply the upper supply potential to the gate of the at last one n channel field effect transistor; wherein the circuit is configured such that the logic state of the gate of the p channel field effect transistors can only be changed by changing a supply of at least one of the first supply voltage and the second supply voltage to the circuit; and the semiconductor chip further includes a connection coupled to the gate of the p channel field effect transistors or the gate of the at least one n channel field effect transistor and the further component of the semiconductor chip. In other words, the circuit may include a plurality of, e.g. serially connected, p channel transistors.

According to one embodiment, the circuit includes a plurality of n channel field effect transistors; wherein the n channel field effect transistors and the at least one p channel field effect transistor are connected such that the at least one p channel field effect transistor, if supplied with a lower supply potential at its gate, supplies the higher supply potential to the gates of the n channel field effect transistors; and the n channel field effect transistors, if supplied with the higher supply potential at their gates, supply the lower supply potential to the gate of the at last one p channel field effect transistor; wherein the circuit is configured such that the logic state of the gate of the n channel field effect transistors can only be changed by changing a supply of at least one of the first supply voltage and the second supply voltage to the circuit; and the semiconductor chip further includes a connection coupled to the gate of the n channel field effect transistors or the gate of the at least one p channel field effect transistor and the further component of the semiconductor chip. In other words, the circuit may include a plurality of, e.g. serially connected, n channel transistors.

According to one embodiment, the circuit includes a plurality of p channel field effect transistors; a plurality of n channel field effect transistors; wherein the p channel field effect transistors and the n channel field effect transistors are connected such that the n channel field effect transistors, if supplied with a upper supply potential at their gates, supply the lower supply potential to the gates of the p channel field effect transistors; and the p channel field effect transistors, if supplied with the lower supply potential at their gates, supply the upper supply potential to the gates of the n channel field effect transistors; wherein the circuit is configured such that the logic state of the gates of the p channel field effect transistors and the logic state of the gates of the n channel field effect transistors can only be changed by changing a supply of at least one of the first supply voltage and the second supply voltage to the circuit; and the semiconductor chip further includes a connection coupled to the gates of the p channel field effect transistors or the gates of the n channel field effect transistors and the further component of the semiconductor chip.

For example, the p channel field effect transistors are connected in series and their gates are connected and the n channel field effect transistors are connected in series and their gates are connected.

According to one embodiment, the circuit further includes at least one second p channel field effect transistor; at least one second n channel field effect transistor; wherein the at least one second p channel field effect transistor and the at least one second n channel field effect transistor are connected such that the at least one second n channel field effect transistor, if supplied with the upper supply potential at its gate, supplies the lower supply potential to the gate of the at least one second p channel field effect transistor; and the at least one second p channel field effect transistor, if supplied with the lower supply potential at its gate, supplies the upper supply potential to the gate of the at least one second n channel field effect transistor; and wherein further at least one of the at least one second n channel field effect transistor, if supplied with the upper supply potential at its gate, supplies the lower supply potential to the gate of the at least one p channel field effect transistor; and the at least one second p channel field effect transistor, if supplied with the lower supply potential at its gate, supplies the upper supply potential to the gate of the at least one n channel field effect transistor. According to one embodiment, in other words, the circuit may include two branches of cross-coupled transistors, wherein one (or both) of the branches are connected such that it switches on the transistors of the other branch.

For example, the circuit is configured such that the logic state of the gate of the at least one second p channel field effect transistor and the logic state of the gate of the at least one second n channel field effect transistor can only be changed by changing a supply of at least one of the first supply voltage and the second supply voltage to the circuit.

According to one embodiment, the semiconductor chip includes a multiplicity of circuits, each circuit including at least one p channel field effect transistor; at least one n channel field effect transistor; a first power supply terminal configured to receive the first supply voltage with the upper supply potential; a second power supply terminal configured to receive the second supply voltage with the lower supply potential; wherein the at least one p channel field effect transistor and the at least one n channel field effect transistor are connected such that the at least one n channel field effect transistor, if supplied with the upper supply potential at its gate, supplies the lower supply potential to the gate of the at least one p channel field effect transistor; and the at least one p channel field effect transistor, if supplied with the lower supply potential at its gate, supplies the upper supply potential to the gate of the at least one n channel field effect transistor; wherein the circuit is configured such that the logic state of the gate of the at least one p channel field effect transistor and the logic state of the gate of the at least one n channel field effect transistor can only be changed by changing a supply of at least one of the first supply voltage and the second supply voltage to the circuit; and the semiconductor chip includes a connection coupled to the gate of the at least one p channel field effect transistor or the gate of the at least one n channel field effect transistor and a further component of the semiconductor chip.

According to one embodiment, the semiconductor chip further includes a second circuit including at least one p channel field effect transistor; at least one n channel field effect transistor; a first power supply terminal configured to receive the first supply voltage with the upper supply potential; a second power supply terminal configured to receive the second supply voltage with the lower supply potential; wherein the at least one p channel field effect transistor and the at least one n channel field effect transistor are connected such that the at least one n channel field effect transistor, if supplied with the upper supply potential at its gate, supplies the lower supply potential to the gate of the at least one p channel field effect transistor; and the at least one p channel field effect transistor, if supplied with the lower supply potential at its gate, supplies the upper supply potential to the gate of the at least one n channel field effect transistor; wherein the circuit is configured such that the logic state of the gate of the at least one p channel field effect transistor and the logic state of the gate of the at least one n channel field effect transistor can only be changed by changing a supply of at least one of the first supply voltage and the second supply voltage to the circuit; and wherein the gate of the at least one p channel field effect transistor and the gate of the at least one n channel field effect transistor are electrically isolated from any further components of the semiconductor chip. In other words, the semiconductor chip may also include circuits as the circuit 101 whose gate states are not forwarded to any other component.

In the following, embodiments are described in more detail.

Figure 2:
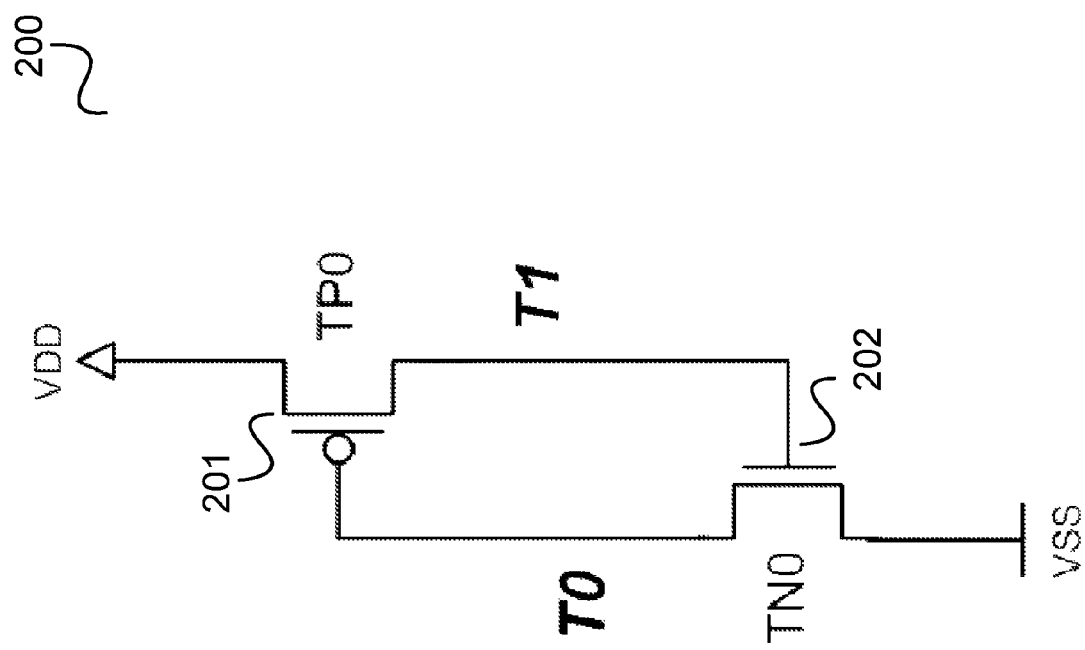
FIG. 2 shows a HC-TIE FILLER cell.

FIG. 2 shows a HC-TIE FILLER cell 200.

The filler cell 200 includes a p channel field effect transistor 201 whose source is connected to a high supply potential (VDD) whose gate is connected to the drain of an n channel field effect transistor 202 and whose drain is connected to the gate of the n channel field effect transistor 202. The source of the n channel field effect transistor 202 is connected to a low supply potential (VSS).

The node (or connection) connecting the gate of the p channel field effect transistor 201 with the drain of the n channel field effect transistor 202 is in the following referred to as T0 and the node (or connection) connecting the gate of the n channel field effect transistor 202 with the drain of the p channel field effect transistor 201 is in the following referred to as T1.

In thermodynamic equilibrium, the node voltages assume the values V(T1)=VDD and V(T0)=VSS (the circuit's relaxation time ranges from some 100 ps up to the nanosecond regime, depending on process technology, supply voltage and temperature).

The TIE-Cell camouflage concept can be seen to make use of the filler cells' "stable and full-level" internal nodes T1=1 (i.e. V(T1)=VDD) and T0=0 (i.e. V(T0)=VSS) for hiding TIE-1 and TIE-0 cells as well as TIE-MUXOR cells.

With the TIE-Cell approach for IC camouflaging it is possible to mislead reverse engineers when trying to extract the logical functions of standard cells, and it is possible to inhibit the use of automated (pattern) recognition for identification of a camouflage gate's functionality and its connectivity with other camouflage gates or with regular gates. That is, TIE-Cell camouflaged gates can be combined with standard logic gates to achieve a reverse engineering resistant IC implementation. Since a multitude of TIE-Cell camouflaged gates can be distributed "irregularly" across an IC's entire Semi-Custom portion (as well as within Full Custom circuitry) the TIE-Cell camouflage concept significantly increases the difficulty, risk and effort for IC Reverse Engineering. Moreover, the TIE-Cell camouflage concept does not require any process technology modification and can be applied to any (CMOS) technology.

According to one embodiment, the TIE-Cell camouflage concept includes the implementation of TIE-1 and TIE-0 cells which may for example be used for TIE-MUXOR gates, as well as for general circuit camouflage.

According to one embodiment, the TIE-1 and TIE-0 cells as well as the TIE-MUXOR gates each contain one HC-TIE FILLER cell and can be implemented and wired in a maximally symmetric way. As a consequence, the TIE-1 and TIE-0, as well as the TIE-MUXOR gate (e.g. in a TIE-MUXOR-1 and a TIE-MUXOR-0 version) can cause considerable confusion for reverse engineering as well as for the navigation in FIB (focused ion beam) attacks targeting at probing/forcing and circuit edit.

Incorporating TIE cells into logic gates allows for a multitude of camouflage options, i.e. for deceiving reverse engineers as to the true function of an integrated circuit. In particular, regular, i.e. deliberate TIE functions can be concealed.

The TIE Cell camouflage concept can also be applied to full custom implementations of data paths, memory macros, etc., for instance by replacing elements of a data path bit slice with camouflage cells (including one or more TIE cells) that conceal the true function and/or fake a non existing function. In general, the TIE Cell camouflage concept is not restricted to STATIC CMOS implementations, but can also be applied to other logic styles like Transmission Gate Logic, N-Pass-Gate Logic, (Dynamical) Precharge Logic, etc., used for example in self-timed circuitry or asynchronous designs.

According to one embodiment, in order to conceal (deliberate) TIE-1 and TIE-0 functions, the TIE-function cells TIE-1 and TIE-0 are derived immediately from the HC-TIE FILLER cell as illustrated in FIG. 2 by just adding output pins for T1 and T0 respectively. This is illustrated in FIG. 3.

Figure 3:
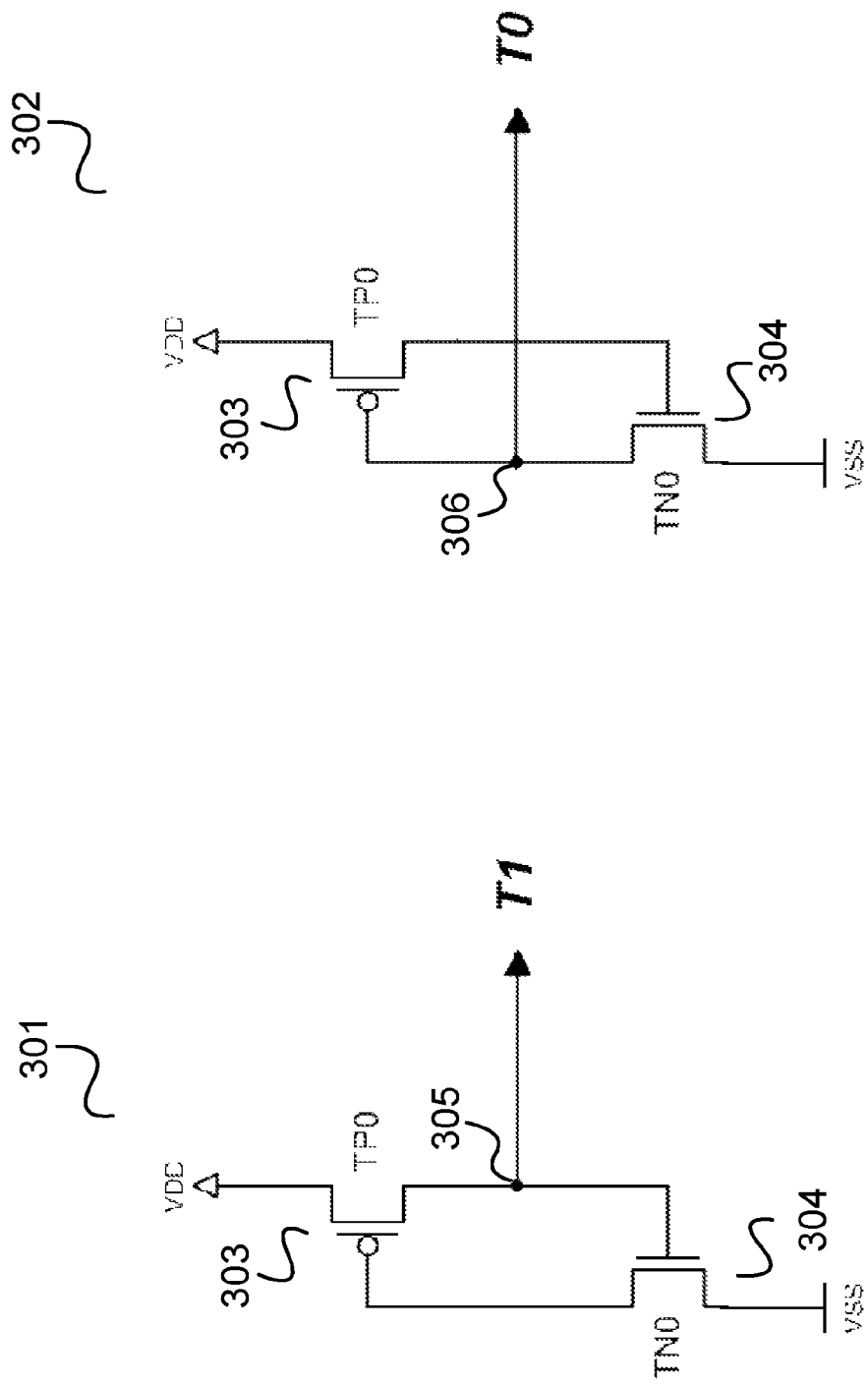
FIG. 3 shows a TIE-1 cell and a TIE-0 cell.

FIG. 3 shows a TIE-1 cell 301 and a TIE-0 cell 302.

The TIE cells 301, 302 each include a p channel FET 303 corresponding to the p channel FET 201 and an n channel FET 304 corresponding to the n channel FET 202 which are connected as explained with reference to FIG. 2.

In addition, the TIE-1 cell 301 has an output 305 which outputs the state of the T1 node and the TIE-0 cell 302 has an output 306 which outputs the state of the T0 node.

A TIE cell 301, 302 as illustrated in FIG. 3 may also have outputs at both the T1 node and the T0 node such that it functions as both a TIE-0 cell and a TIE-1 cell.

By this implementation, the TIE-1 cell and the TIE-0 cell can be made indistinguishable from the corresponding HC-TIE FILLER cell 200 in terms of their physical design (i.e. the layout of active (diffusion) regions, gate poly-silicon, metal wiring, contacts, etc.). In other words, a semiconductor chip may be provided which includes at least one TIE cell and at least one HC-TIE FILLER cell which have a similar physical design.

Figure 4:
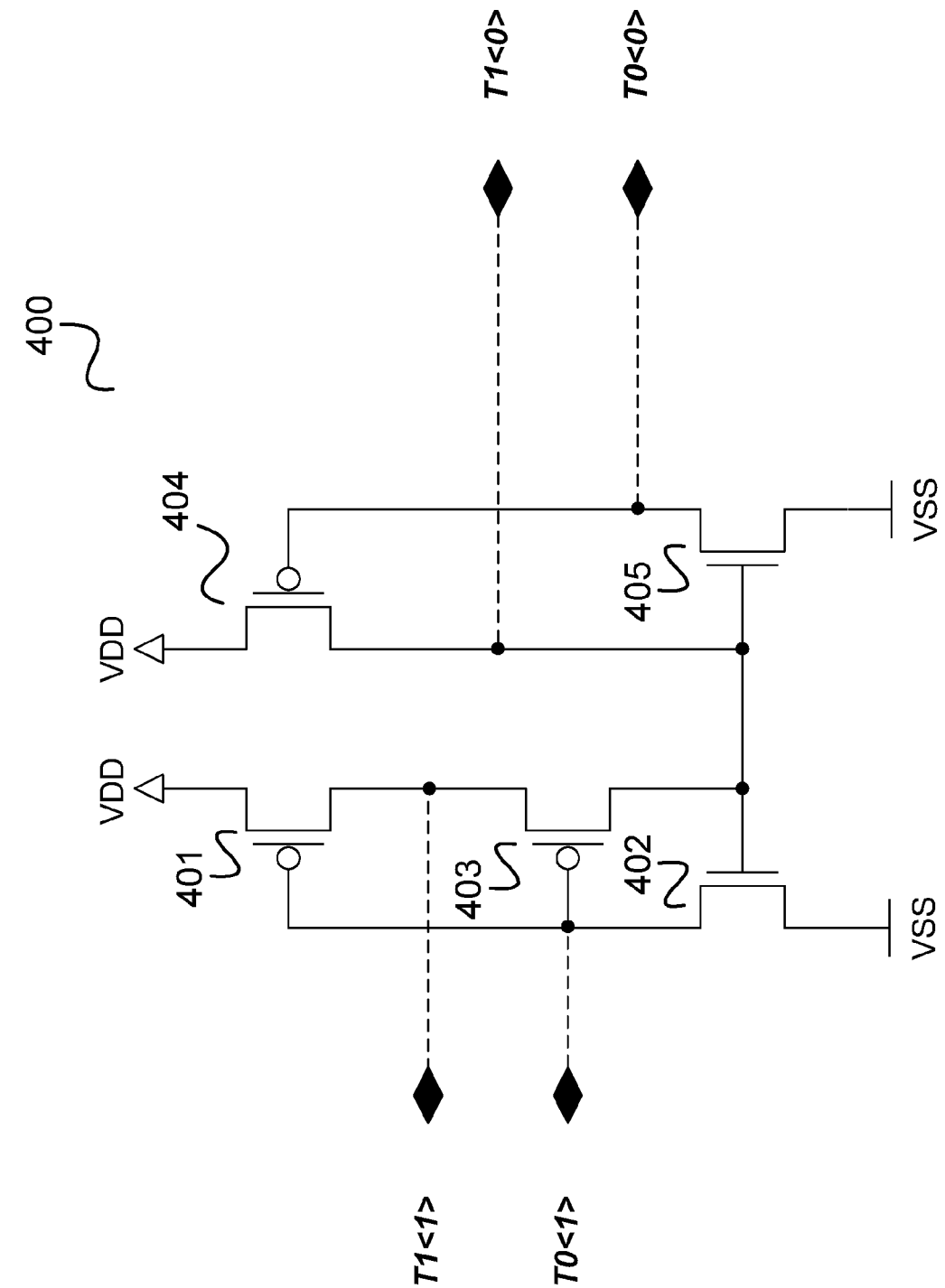
FIG. 4 shows a TIE cell according to an embodiment.

According to one embodiment, the (HC-) TIE cell camouflage concept is generalized as illustrated in FIG. 4.

FIG. 4 shows a TIE cell 400 according to an embodiment.

The TIE cell 400 includes a first p channel FET 401 whose source is connected to the high supply potential, whose gate is connected to the drain of a first n channel FET 402 and whose drain is connected to the source of a second p channel FET 403.

The drain of the second p channel FET 403 is connected to the gate of the first n channel FET 402. The source of the second n channel FET 402 is connected to the low supply potential.

The TIE cell 400 further includes a third p channel FET 404 whose source is connected to the high supply potential, whose gate is connected to the drain of a second n channel FET 405 and whose drain is connected to the gate of the second n channel FET 405 which is also connected to the gate of the first n channel FET 402. The source of the second n channel FET 405 is connected to the low supply potential.

Thus, a six-transistor TIE Cell is provided that exhibits two options each for TIE-1 and TIE-0 pins: To form a TIE-1 cell, the node T1<0> which connects the drain of the third p channel FET 404 with the gate of the second n channel FET 405 and/or the node T1<1> which connects the drain of the first p channel FET 401 with the source of the second p channel FET 403 may be used as output nodes of the TIE cell.

To form a TIE-0 cell, the node T0<0> which connects the gate of the third p channel FET 404 with the drain of the third n channel FET 405 and/or the node T0<1> which connects the gate of the first p channel FET 401 with the drain of the first n channel FET 402 may be used as output nodes of the TIE cell.

According to one embodiment, a multitude of (e.g. already implemented) (HC-TIE) FILLER cells in an integrated circuit (or integrated circuit design) are replaced by TIE-1 and TIE-0 cells and the TIE cell outputs T1 and/or T0 are connected to METAL FILL structures and/or dummy logic gates, thereby misleading the reverse engineer by faking TIE-functions, signal path elements and even feedback loops (of e.g. Finite State Machines). This is illustrated in FIG. 5.

Figure 5:
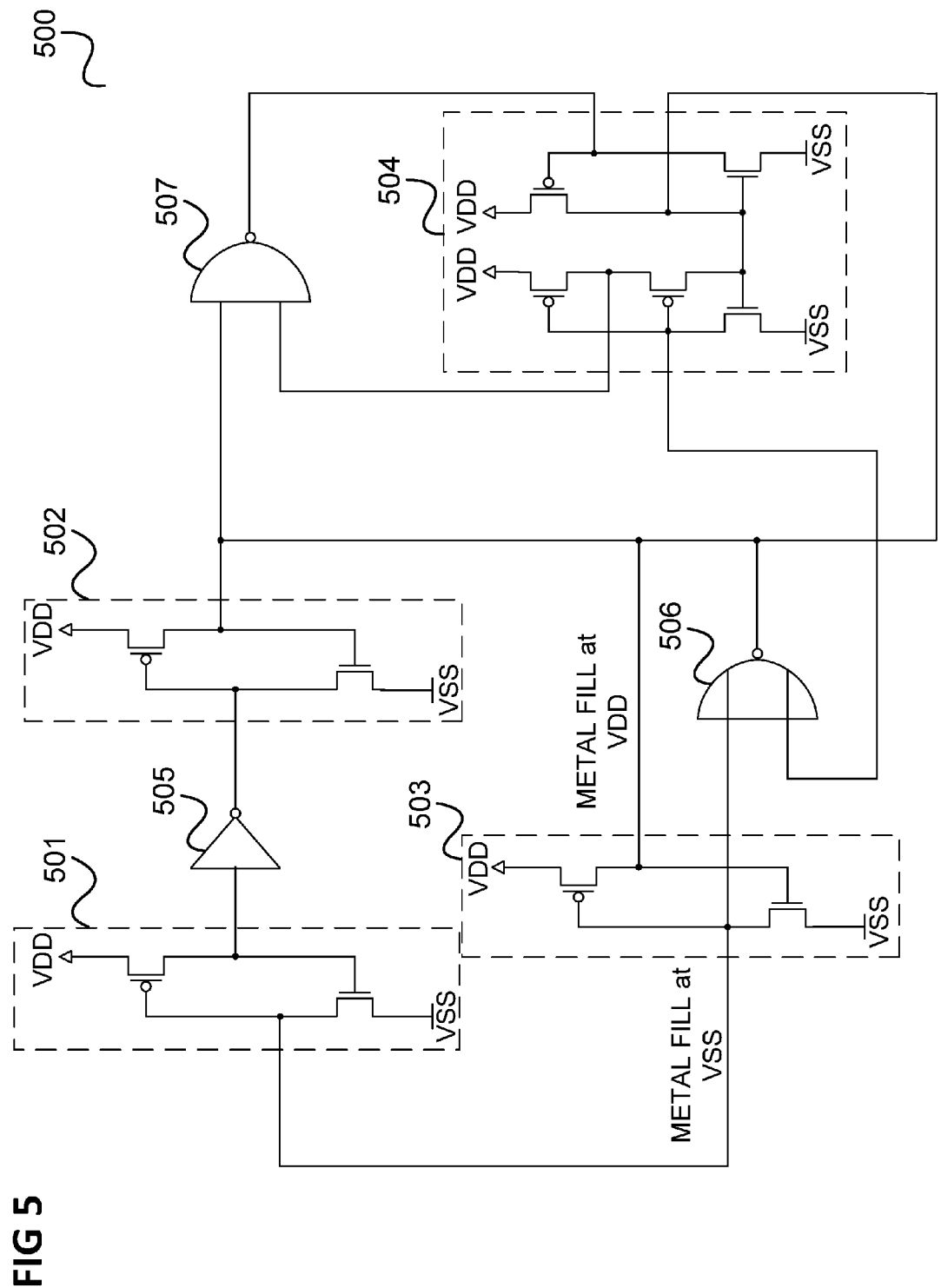
FIG. 5 shows an integrated circuit according to an embodiment.

FIG. 5 shows an integrated circuit 500.

The circuit 500 includes a first TIE cell 501, a second TIE cell 502 and a third TIE cell 503 as illustrated in FIG. 3 and a fourth TIE cell 504 as illustrated in FIG. 4.

The T0 output of the first TIE cell 501 is connected to the T0 output of the third TIE cell 503.

The T1 output of the first TIE cell 501 is connected via an inverter 505 to the T0 output of the second TIE cell 502.

The T1 output of the second TIE cell 502 is connected via a Metal fill to the T1 output of the third TIE cell 503.

The T0 output of the third TIE cell 503 and the T0<1> output of the fourth TIE cell 504 are fed to the inputs of a NOR gate 506 whose output is connected to the T1 output of the second TIE cell 502

The T1 output of the second TIE cell 502 is further supplied together with the T1<1> output of the fourth TIE cell 504 to the inputs of a NAND gate 507 whose output is connected to the T0<0> output of the fourth TIE cell 504.

Further, the output of the NOR gate 506 is connected to the T1<0> output of the fourth TIE cell 504.

As illustrated in FIG. 5, various connections of TIE cells may be used to make the reverse engineering of regular, i.e. deliberate TIE-1 and TIE-0 cells, more complicated. Moreover, for a successful reverse engineering, in any reverse engineered netlist, TIE FILLER cells must not be omitted or skipped, but must always be considered together with the entire regular and/or dummy circuitry connected.

Figure 6:
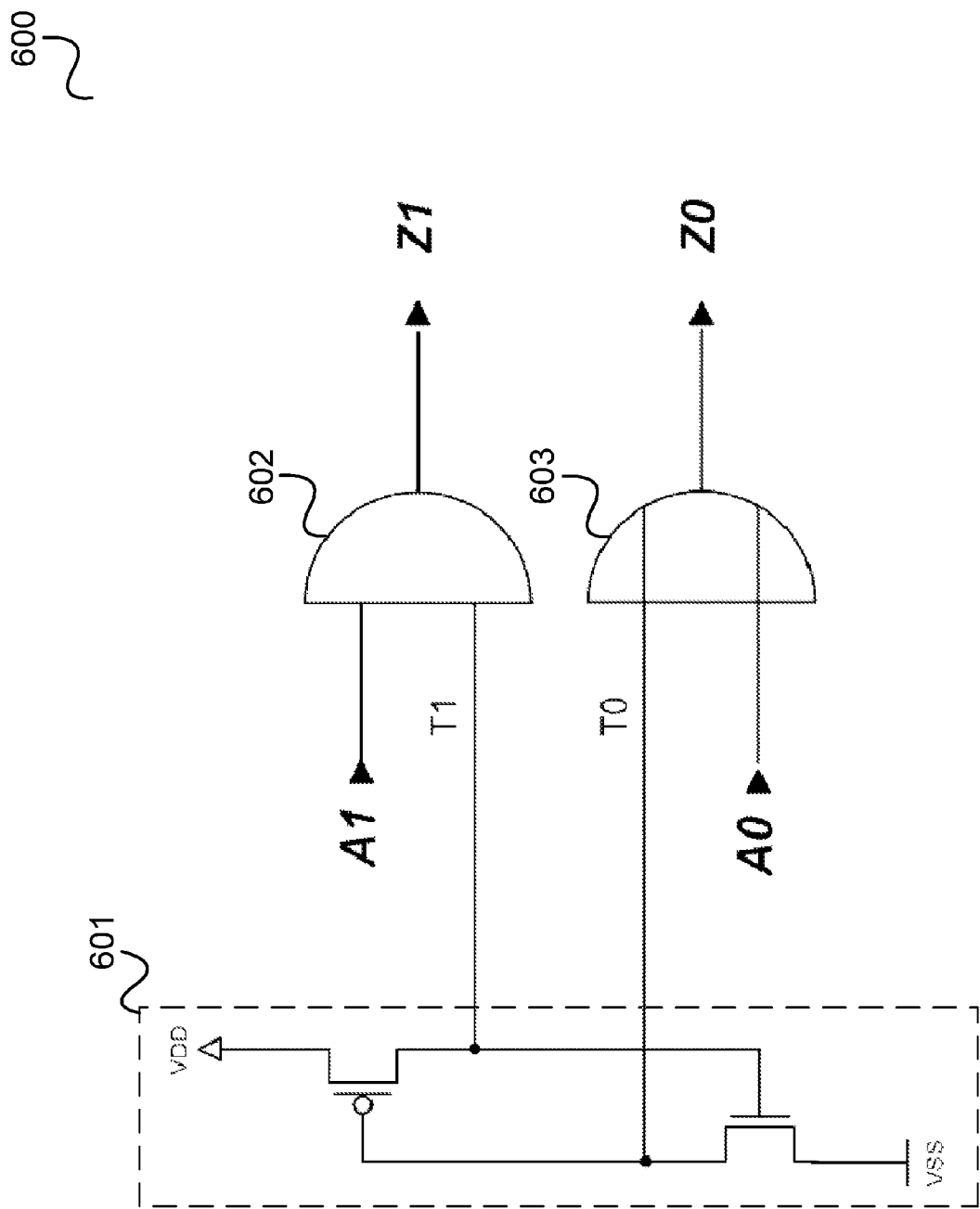
FIG. 6 shows an integrated circuit according to an embodiment.

Another option is to connect the T1 outputs and/or T0 outputs of one or more TIE cells to gates that propagate regular signals as illustrated in FIG. 6.

FIG. 6 shows an integrated circuit 600.

The circuit 600 includes a TIE cell 601 as illustrated in FIG. 3 whose T1 output is fed together with a signal A1 to an AND gate 602 and whose T0 output is fed together with a signal A0 to an OR gate 603.

Thus, if the circuit 600 functions normally, the AND gate 602 and the OR gate 603 propagate the signals A1 and A0 as output signals Z1 and Z0, respectively.

In addition to confusing reverse engineering, violation of the physical integrity of the TIE cell 601 e.g. by an invasive attack like FIB circuit edit, induces the risk of blocking the regular data path flow. For instance, if A1 is a regular signal, and if violation of the TIE cell 601 results in the TIE cell's node T1 floating to VSS, then the data path of a larger circuit or semiconductor chip including the circuit 600 is partially blocked resulting in a possible malfunction of the larger circuit or semiconductor chip.

Figure 7:
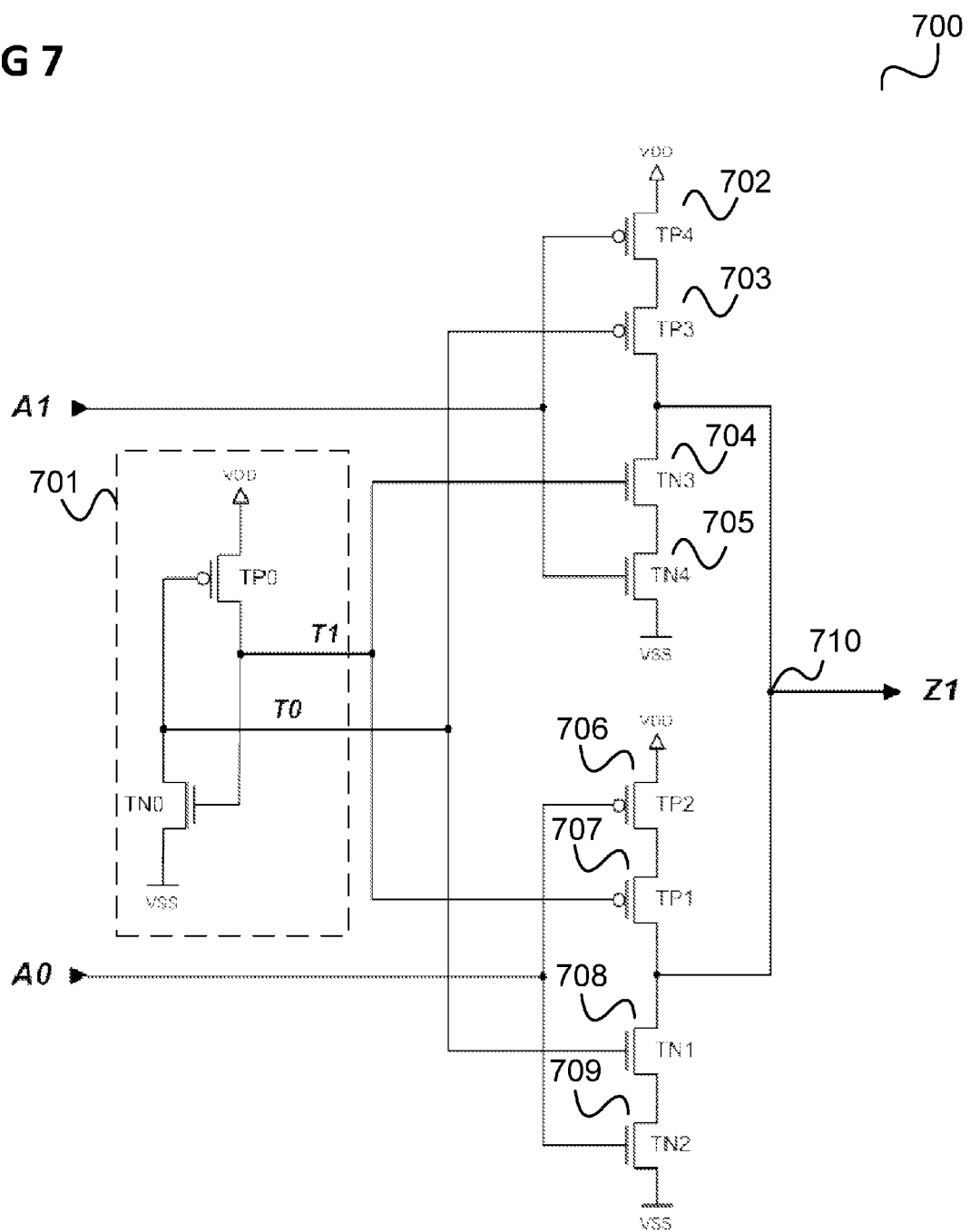
FIG. 7 shows a TIE-MUXOR-1 cell according to an embodiment.
Figure 8:
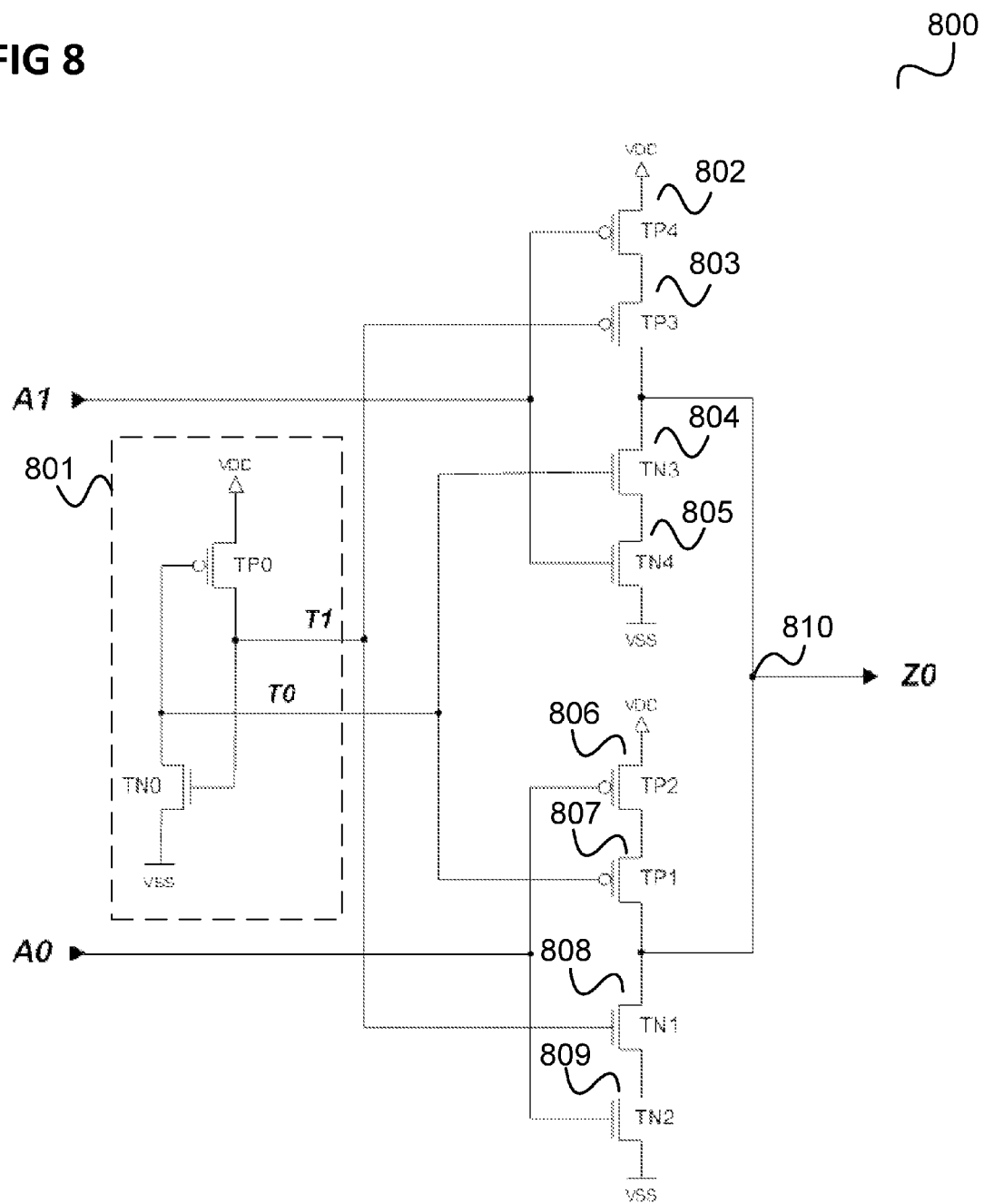
FIG. 8 shows a TIE-MUXOR-0 cell according to an embodiment.

TIE-MUXOR cells according to an embodiment are illustrated in FIGS. 7 and 8. They can be seen to represent almost identical faked multiplexers that simply invert one of the inputs.

FIG. 7 shows a TIE-MUXOR-1 cell 700 according to an embodiment.

The TIE-MUXOR-1 cell 700 includes a TIE cell 701 as illustrated in FIG. 3.

The TIE-MUXOR-1 cell 700 further includes a first p channel FET 702 whose source is connected to VDD, whose gate is supplied with a first input signal A1 and whose drain is connected to the source of a second p channel FET 703.

The gate of the second p channel FET 703 is connected to the T0 output of the TIE cell 701 and its drain is connected to a first n channel FET 704. The gate of the first n channel FET 704 is connected to the T1 output of the TIE cell 701 and its source is connected to the drain of a second n channel FET 705. The gate of the second n channel FET 705 is supplied with the first input signal A1 and its source is connected to VSS.

The TIE-MUXOR-1 cell 700 further includes a third p channel FET 706 whose source is connected to VDD, whose gate is supplied with a second input signal A0 and whose drain is connected to the source of a fourth p channel FET 707.

The gate of the fourth p channel FET 707 is connected to the T1 output of the TIE cell 701 and its drain is connected to a third n channel FET 708. The gate of the third n channel FET 708 is connected to the T0 output of the TIE cell 701 and its source is connected to the drain of a fourth n channel FET 709. The gate of the fourth n channel FET 709 is supplied with the second input signal A0 and its source is connected to VSS.

The drain of the second p channel FET 703 and the drain of the fourth p channel FET 707 are connected to an output terminal 710. The output signal Z1 is given by Z1=NOT (A1).

FIG. 8 shows a TIE-MUXOR-0 cell 800 according to an embodiment.

The TIE-MUXOR-0 cell 800 includes a TIE cell 801 as illustrated in FIG. 3.

The TIE-MUXOR-0 cell 800 further includes a first p channel FET 802 whose source is connected to VDD, whose gate is supplied with a first input signal A1 and whose drain is connected to the source of a second p channel FET 803.

The gate of the second p channel FET 803 is connected to the T1 output of the TIE cell 801 and its drain is connected to a first n channel FET 804. The gate of the first n channel FET 804 is connected to the T0 output of the TIE cell 801 and its source is connected to the drain of a second n channel FET 805. The gate of the second n channel FET 805 is supplied with the first input signal A1 and its source is connected to VSS.

The TIE-MUXOR-0 cell 800 further includes a third p channel FET 806 whose source is connected to VDD, whose gate is supplied with a second input signal A0 and whose drain is connected to the source of a fourth p channel FET 807.

The gate of the fourth p channel FET 807 is connected to the T0 output of the TIE cell 801 and its drain is connected to a third n channel FET 808. The gate of the third n channel FET 808 is connected to the T1 output of the TIE cell 801 and its source is connected to the drain of a fourth n channel FET 809. The gate of the fourth n channel FET 809 is supplied with the second input signal A0 and its source is connected to VSS.

The drain of the second p channel FET 803 and the drain of the fourth p channel FET 807 are connected to an output terminal 810. The output signal Z0 is given by Z0=NOT (A0).

Another way to conceal regular TIE-1 and TIE-0 functions is TIE cell circuit camouflage as described in the following. Namely, TIE functions can not only be incorporated but even integrated into (in the sense of interwoven with) virtually all elements of a standard cell library. This is illustrated in FIG. 9.

Figure 9:
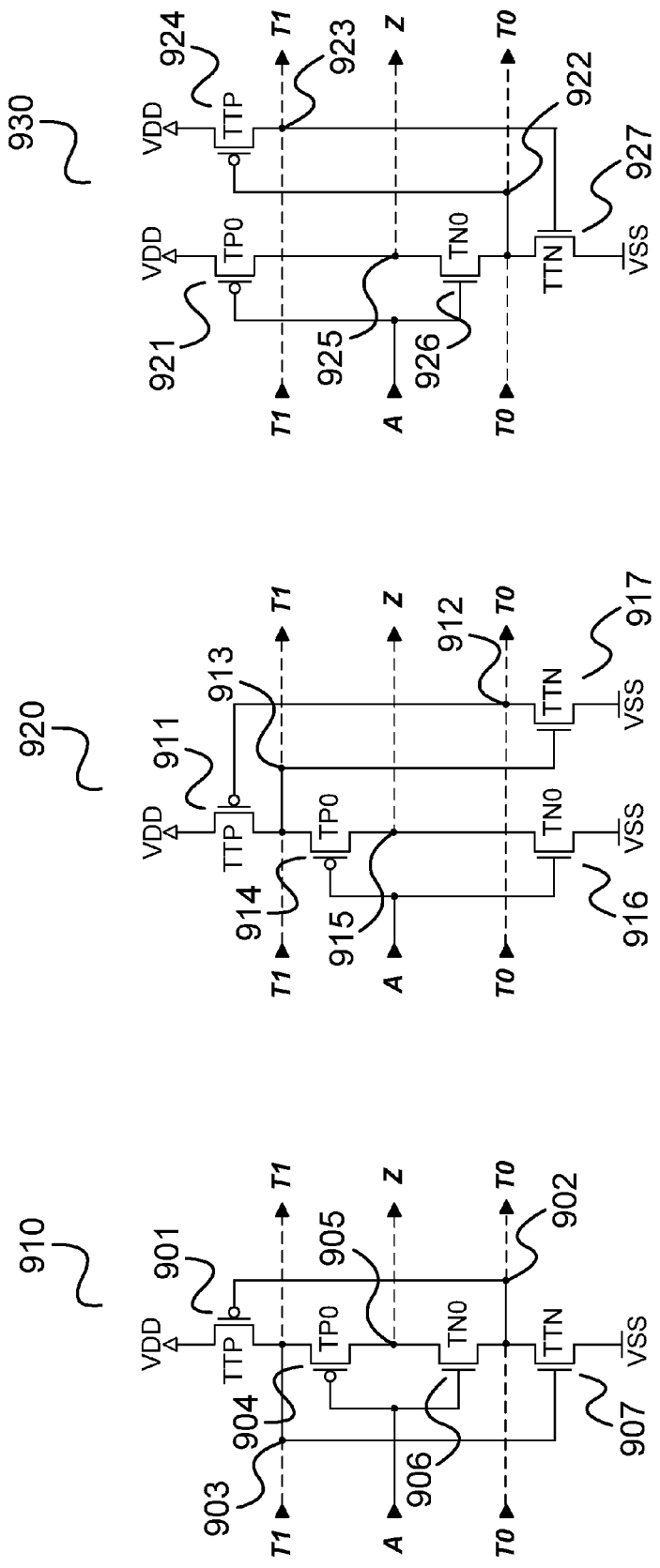
FIG. 9 shows circuits according to an embodiment.

FIG. 9 shows circuits 910, 920, 930.

The circuits 910, 920, 930 can be seen to show three cell-internal wiring options for a four-transistor camouflage inverter.

The first circuit 910 includes a first p channel FET 901 whose source is connected to VDD, whose gate is connected to a T0 node 902 and whose drain is connected to a T1 node 903.

The T1 node 903 is connected to the source of a second p channel FET 904 whose gate is supplied with an input signal A and whose drain is connected to an output terminal 905 outputting output signal Z.

The output terminal 905 is further connected to the drain of a first n channel FET 906 whose gate is supplied with the input signal A and whose source is connected to the T0 node 902.

The T0 node 902 is further connected to the drain of a second n channel FET 907 whose gate is connected to the T1 node 903 and whose source is connected to VSS.

The second circuit 920 includes a first p channel FET 911 whose source is connected to VDD, whose gate is connected to a T0 node 912 and whose drain is connected to a T1 node 913.

The T1 node 913 is connected to the source of a second p channel FET 914 whose gate is supplied with an input signal A and whose drain is connected to an output terminal 915 outputting output signal Z.

The output terminal 915 is further connected to the drain of a first n channel FET 916 whose gate is supplied with the input signal A and whose source is connected to VSS.

The T0 node 912 is further connected to the drain of a second n channel FET 917 whose gate is connected to the T1 node 913 and whose source is connected to VSS.

The third circuit 930 includes a first p channel FET 921 whose source is connected to VDD, whose gate is supplied with an input signal A and whose drain is connected to an output terminal 925 outputting output signal Z.

The third circuit 930 further includes a second p channel FET 924 whose source is connected to VDD, whose gate is connected to a T0 node 922 and whose drain is connected a T1 node 923.

The output terminal 925 is further connected to the drain of a first n channel FET 926 whose gate is supplied with the input signal A and whose source is connected to the T0 node 922.

The T0 node 922 is further connected to the drain of a second n channel FET 927 whose gate is connected to the T1 node 923 and whose source is connected to VSS.

The T1 903, 913, 923 nodes and the T0 nodes 902, 912, 922 may be seen (and used) as both input and output terminals.

The circuits 910, 920, 930 can each be seen as a Four-Transistor-Static-CMOS gate (assuming that the n channel FETs are n channel MOSFETs and the p channel FETs are p channel MOSFETs), whose true function depends on its external connectivity. There are at least the following five options, where it is assumed that input A is always connected to another gate's output:

1st Option: only output Z is supplied to another gate's input; then, two of the four transistors may be misinterpreted as belonging to a different neighboring gate, thereby confusing its identification.

2nd Option: output Z is supplied to another gate's input; then, one of the nodes T1 or T0, if only connected to other circuitry (e.g. like described above), may be misinterpreted as input of a four-transistor gate with unknown function (e.g. NAND, NOR, or BUFFER could be possible), whereas the gate's true function is Z=NOT(A).

3rd Option: the T1 node is connected to another gate's input (e.g. like described above), and the output terminal Z is not connected; then, the T0 node, if only connected to other circuitry (e.g. like described above), may be misinterpreted as input of a four-transistor gate with unknown function (e.g. NAND, NOR, or BUFFER), whereas the gate's true function is T1=1 (concealed TIE function).

4th Option: the T0 node is connected to another gate's input (e.g. like described above), and the output terminal is not connected; then, the T1 node, if only connected to other circuitry (e.g. like described above), may be misinterpreted as input of a four-transistor gate with unknown function (e.g. NAND, NOR, or BUFFER), whereas the gate's true function is T0=0 (concealed TIE function).

5th Option: the output Z is supplied to an external gate's input; then, both the T1 node and the T0 node, if only connected to other circuitry (e.g. like described above), may be misinterpreted as inputs of a six-transistor gate with unknown function, so that two transistors of neighboring gates may be misinterpreted as belonging to the four-transistor-camouflage inverter of FIG. 9.

Figure 10:
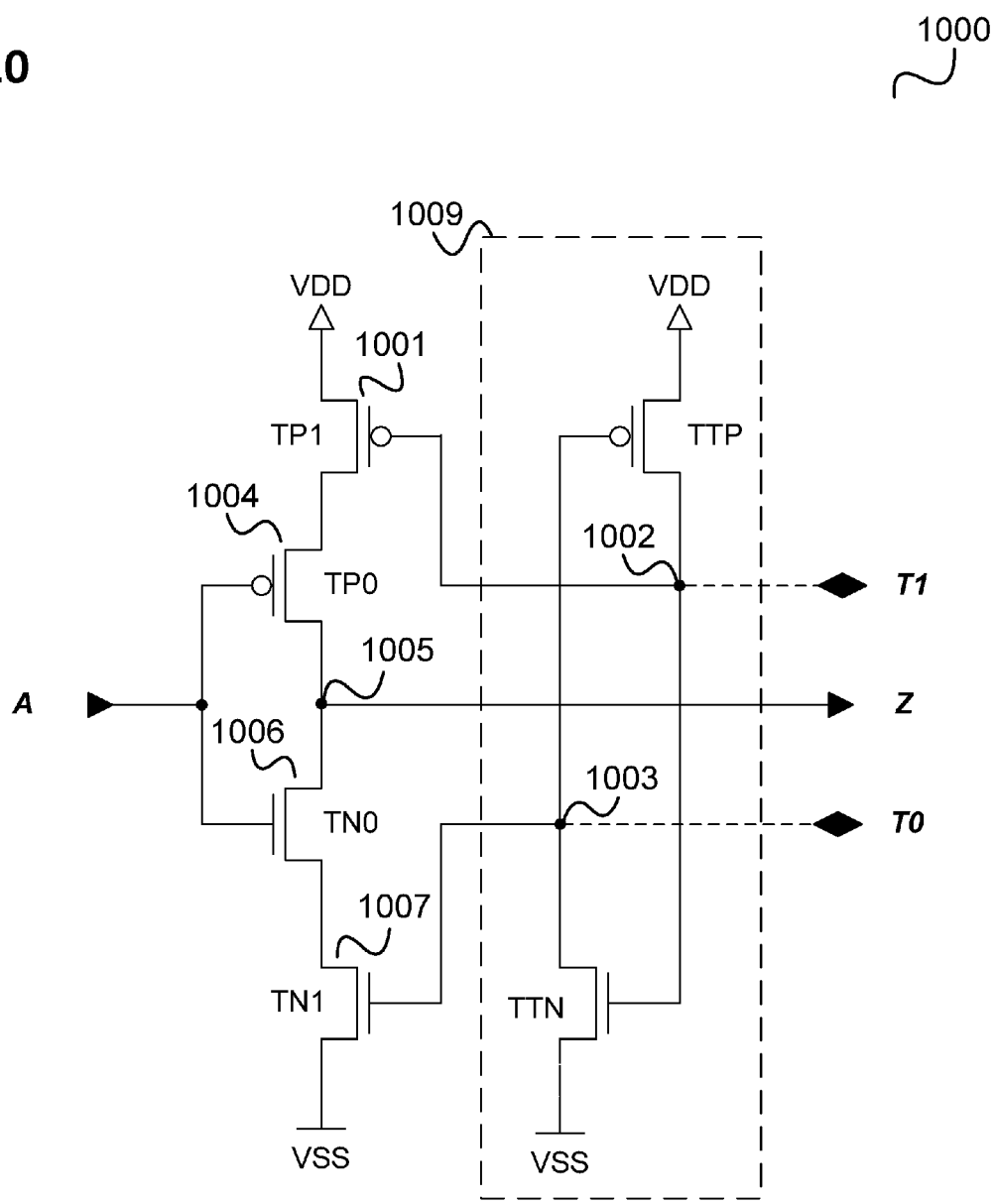
FIG. 10 shows a circuit according to an embodiment.

Another example, the so-called NEVER gate, is illustrated in FIG. 10.

FIG. 10 shows a circuit 1000.

The circuit 1000 includes a TIE cell 1009 as illustrated in FIG. 3.

The circuit 1000 further includes a first p channel FET 1001 whose source is connected to VDD, whose gate is connected to the T1 node 1002 and whose drain is connected to the source of a second p channel FET 1004 whose gate is supplied with an input signal A and whose drain is connected to an output terminal 1005 outputting output signal Z.

The output terminal 1005 is further connected to the drain of a first n channel FET 1006 whose gate is supplied with the input signal A and whose source is connected to the drain of a second n channel FET 1007 whose gate is connected to the T0 node 1003 and whose source is connected to VSS.

Assuming that the n channel FETs are n channel MOSFETs and the p channel FETs are p channel MOSFETs the circuit 1000 can be seen as a six-transistor CMOS gate which is internally wired in a way so that the output Z always floats, independently of input A, i.e. Z is never driven, neither to VDD nor to VSS, since it is isolated by appropriately connected T1 and T0 nodes of the TIE cell 1009.

As for the circuits illustrated in FIG. 9, there are different options as for externally connecting the T1 node 1002, the T0 node 1003 and the output terminal 1005 (i.e. for "promoting" a node to be a pin), and thereby different options for misleading reverse engineers:

1st Option: the floating output terminal is connected either to
  another gate's output, or to
  another TIE cell's T1 node or T0 node, or to
  another camouflage cell's floating output terminal, and/or to
  metal fill structures, etc.
then, the T1 node and the T0 node, if only connected to external circuitry (e.g. like described above), may be misinterpreted as inputs of a six-transistor gate with unknown function, whereas the gate's true function is simply NEVER.

2nd Option: the T1 node is connected to another gate's input (e.g. like described above), and the output terminal 1005 is not connected; then, the T0 node, if only connected to other circuitry (e.g. like described above), may be misinterpreted as input of a gate with unknown function, whereas the gates true function is T1=1.

3rd Option: the T0 node is connected to another gate's input (e.g. like described above), and the output terminal 1005 is not connected; then, the T1 node, if only connected to other circuitry (e.g. like described above), may be misinterpreted as input of a gate with unknown function, whereas the gate's true function is T0=0.

Figure 11:
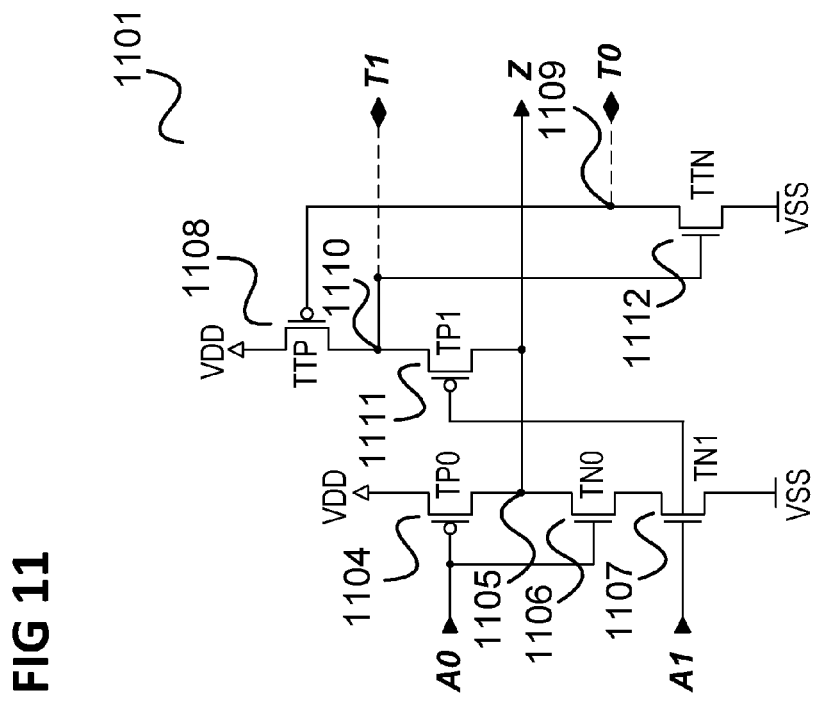
FIG. 11 shows a circuit according to an embodiment and an ANDNOR gate illustrating its faked function and a NAND gate illustrating its true function.

A further example is shown in FIG. 11.

FIG. 11 shows a circuit 1101 and an ANDNOR gate 1102 illustrating its faked function and a NAND gate 1103 illustrating its true function.

The circuit 1101 includes a first p channel FET 1104 whose source is connected to VDD, whose gate is supplied with a first input signal A0 and whose drain is connected to an output terminal 1105 outputting an output signal Z.

The output terminal 1105 is further connected to the drain of a first n channel FET 1106 whose gate is supplied with the first input signal A0 and whose source is connected to the drain of a second n channel FET 1107. The gate of the second n channel FET 1107 is supplied with a second input signal A1 and its source is connected to VSS.

The circuit 1101 further includes a second p channel FET 1108 whose source is connected to VDD, whose gate is connected to a T0 node 1109 and whose drain is connected to a T1 node 1110.

The T1 node 1110 is further connected to the source of a third p channel FET 1111 whose gate is supplied with the second input signal A1 and whose drain is connected to the output terminal 1105.

The T1 node 1110 is further connected to the gate of a third n channel FET 1112 whose drain is connected to the T0 node 1109 and whose source is connected to VSS.

The faked function of the circuit 1101 corresponds to the input signals A1 and A0 being supplied to the AND inputs of ANDNOR gate 1102 and the T1 node (or the T0 node) being connected to the NOR input of ANDNOR gate 1102 such that Z=NOR(T1, AND(A1, A0)) or (Z=NOR(T0, AND (A1, A0)).

The true function of the circuit 1101 corresponds to the input signals A1 and A0 being supplied to NAND gate 1103 such that Z=NAND(A1, A0).

Again, the T1 node and the T0 node can optionally be connected to external circuitry and/or to metal fill structures, so that a reverse engineer may be mislead when trying to identify the circuit's function. A probable misinterpretation is the ANDNOR.

Figure 12:
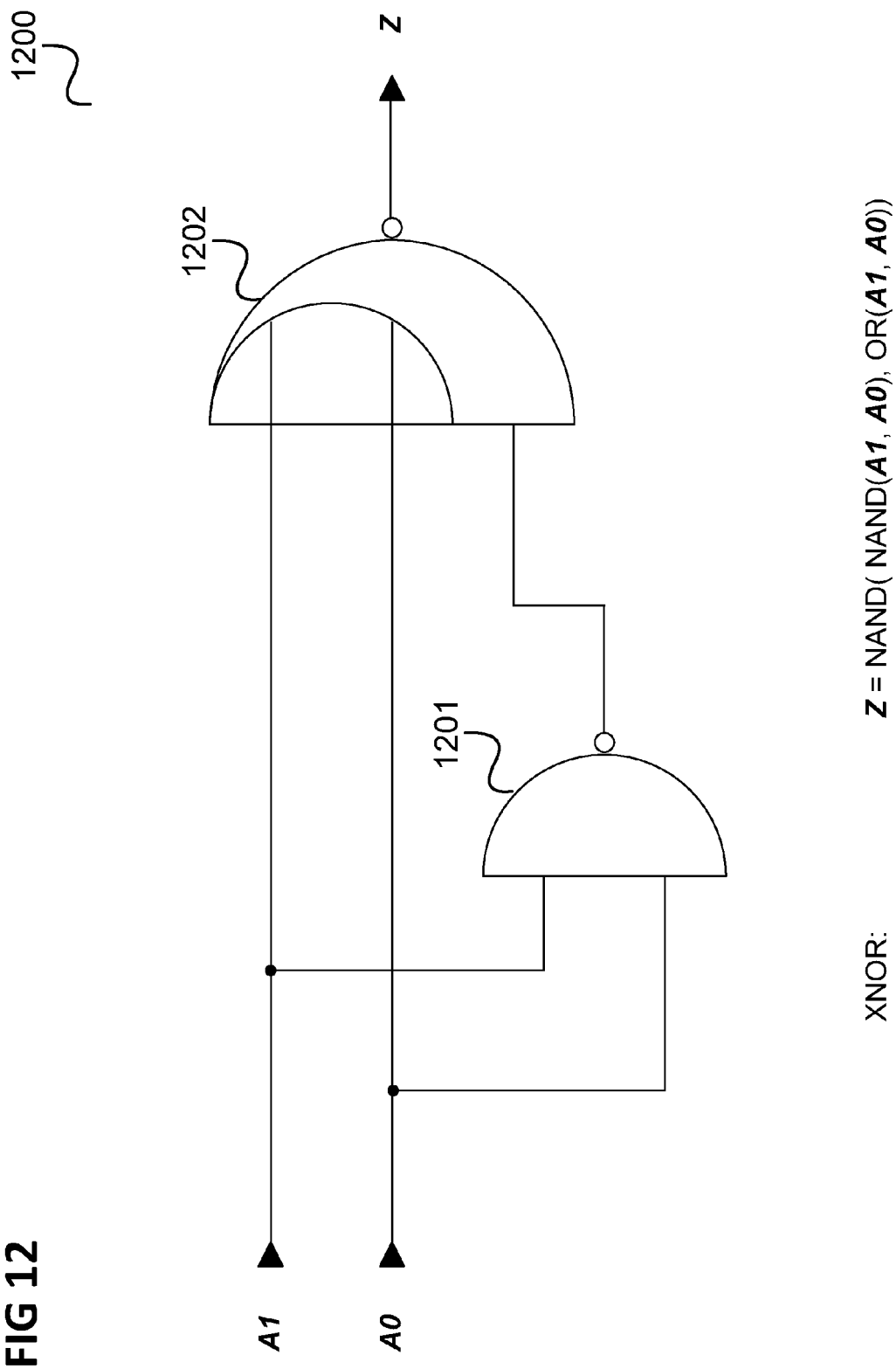
FIG. 12 shows an XNOR circuit according to an embodiment.

The faked ANDNOR can for instance be used to conceal an XNOR implementation as illustrated in FIG. 12.

FIG. 12 shows an XNOR circuit 1200.

The circuit 1200 includes a NAND gate 1201 that is supplied with an input signal A0 and an input signal A1. The circuit 1200 further includes an ORNAND gate 1202 whose OR inputs are supplied with the inputs signals A0 and A1 and whose NAND input is supplied with the output of the NAND gate 1201. The output signal of the ORNAND gate 1202 is the circuit's output Z which is given by Z=NAND (NAND(A1, A0), OR(A1, A0)).

The XNOR circuit 1200 may be concealed by using the circuit 1101 of FIG. 11 (i.e. the faked ANDNOR) as the NAND 1201. In addition to that, a XNOR standard cell (i.e. the circuit 1200 being implemented within one single library element) can first be decomposed into a NAND gate and an ORNAND gate, and after that the NAND is replaced by the faked ANDNOR of FIG. 11. In general, any complex gate (like XOR, ANDNOR, etc.) can be concealed in this way by first decomposing and then TIE-faking one or more components.

The TIE cell camouflage concept can be applied to substantially all elements of a standard cell library. Thus, a set of arbitrarily many of these camouflage gates can be provided. Thus, it is possible not only to generate also feigned sequential gates like latches and master-slave flip-flops (whose true function is, e.g., simply a buffer), but also to feign false feedback loops in finite state machines (FSMs) or even feign complete FSMs.

As a consequence, if sufficiently many of these camouflage gates are implemented, the reverse engineering effort to unravel their true functions, identifying all NEVER gates' dead ends, all false feedback loops, etc. can be increased significantly.

By means of careful physical design it is in many cases possible to provide camouflage gates that feature only slightly different layouts compared to the respective layouts of the feigned gate. This even complicates the manual reverse engineering that will be the necessary first step for enhancing the functionality of any automated approach to reverse engineer camouflaged IC implementations.

It should be noted that the TIE Cell camouflage concept can also be applied to full-custom implementations of data paths, memory macros, etc., by replacing for instance regular elements of a data path bit slice with camouflage cells that conceal the true function and/or fake a non existing function. In general, the TIE cell camouflage concept is not restricted to static CMOS implementations, but can also be applied to other logic styles like transmission gate logic, N-pass-gate logic, (dynamical) precharge logic, etc., used for example in self-timed circuitry or asynchronous designs.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A semiconductor chip comprising:
 a circuit comprising
  a plurality of p channel field effect transistors wherein the p channel field effect transistors are connected in series and their gates are connected;
  a plurality of n channel field effect transistors wherein the n channel field effect transistors are connected in series and their gates are connected;
  a first power supply terminal configured to receive a first supply voltage with an upper supply potential; and
  a second power supply terminal configured to receive a second supply voltage with a lower supply potential;
  wherein the p channel field effect transistors and the n channel field effect transistors are connected such that
   the n channel field effect transistors, if supplied with the upper supply potential at their gates, supply the lower supply potential to the gates of the p channel field effect transistors; and
   the p channel field effect transistors, if supplied with the lower supply potential at their gates, supply the upper supply potential to the gates of the n channel field effect transistors;
  wherein the circuit is configured such that the logic state of the gates of the p channel field effect transistors and the logic state of the gates of the n channel field effect transistors can only be changed by changing a supply of at least one of the first supply voltage and the second supply voltage to the circuit; and
 a connection coupled to the gates of the p channel field effect transistors or the gates of the n channel field effect transistors and a further component of the semiconductor chip.

2. A semiconductor chip comprising:
 a circuit comprising
  at least one p channel field effect transistor;
  at least one n channel field effect transistor;
  a first power supply terminal configured to receive a first supply voltage with an upper supply potential; and
  a second power supply terminal configured to receive a second supply voltage with a lower supply potential;
  wherein the at least one p channel field effect transistor and the at least one n channel field effect transistor are connected such that
   the at least one n channel field effect transistor, if supplied with the upper supply potential at its gate, supplies the lower supply potential to the gate of the at least one p channel field effect transistor; and
   the at least one p channel field effect transistor, if supplied with the lower supply potential at its gate, supplies the upper supply potential to the gate of the at least one n channel field effect transistor;
  wherein the circuit is configured such that the logic state of the gate of the at least one p channel field effect transistor and the logic state of the gate of the at least one n channel field effect transistor can only be changed by changing a supply of at least one of the first supply voltage and the second supply voltage to the circuit; and
 a connection coupled to the gate of the at least one p channel field effect transistor or the gate of the at least one n channel field effect transistor and a dummy gate or a metal fill structure of the semiconductor chip.

3. The semiconductor chip according to claim 2, wherein the connection is configured to supply the logic state of the gate of the at least one p channel field effect transistor to the dummy gate or metal fill structure of the semiconductor chip.

4. The semiconductor chip according to claim 2, comprising a first connection coupled to the gate of the at least one p channel field effect transistor and a first further component of the semiconductor chip and a second connection coupled to the gate of the at least one n channel field effect transistor and a second further component of the semiconductor chip.

5. The semiconductor chip according to claim 2, wherein the circuit comprises:
 a plurality of p channel field effect transistors;

wherein the p channel field effect transistors and the at least one n channel field effect transistor are connected such that
the at least one n channel field effect transistor, if supplied with a upper supply potential at its gate, supplies the lower supply potential to the gates of the p channel field effect transistors; and
the p channel field effect transistors, if supplied with the lower supply potential at their gates, supply the upper supply potential to the gate of the at last one n channel field effect transistor;
wherein the circuit is configured such that the logic state of the gate of the p channel field effect transistors can only be changed by changing a supply of at least one of the first supply voltage and the second supply voltage to the circuit; and
wherein the semiconductor chip further comprises a connection coupled to the gate of the p channel field effect transistors or the gate of the at least one n channel field effect transistor and the dummy gate or metal fill structure of the semiconductor chip.

6. The semiconductor chip according to claim 2, wherein the circuit comprises:
a plurality of n channel field effect transistors;
wherein the n channel field effect transistors and the at least one p channel field effect transistor are connected such that
the at least one p channel field effect transistor, if supplied with a lower supply potential at its gate, supplies the higher supply potential to the gates of the n channel field effect transistors; and
the n channel field effect transistors, if supplied with the higher supply potential at their gates, supply the lower supply potential to the gate of the at last one p channel field effect transistor;
wherein the circuit is configured such that the logic state of the gate of the n channel field effect transistors can only be changed by changing a supply of at least one of the first supply voltage and the second supply voltage to the circuit; and
wherein the semiconductor chip further comprises a connection coupled to the gate of the n channel field effect transistors or the gate of the at least one p channel field effect transistor and the dummy gate or metal fill structure of the semiconductor chip.

7. The semiconductor chip according to claim 2, wherein the circuit comprises:
a plurality of p channel field effect transistors;
a plurality of n channel field effect transistors;
wherein the p channel field effect transistors and the n channel field effect transistors are connected such that
the n channel field effect transistors, if supplied with a upper supply potential at their gates, supply the lower supply potential to the gates of the p channel field effect transistors; and
the p channel field effect transistors, if supplied with the lower supply potential at their gates, supply the upper supply potential to the gates of the n channel field effect transistors;
wherein the circuit is configured such that the logic state of the gates of the p channel field effect transistors and the logic state of the gates of the n channel field effect transistors can only be changed by changing a supply of at least one of the first supply voltage and the second supply voltage to the circuit; and
wherein the semiconductor chip further comprises a connection coupled to the gates of the p channel field effect transistors or the gates of the n channel field effect transistors and the dummy gate or metal fill structure of the semiconductor chip.

8. The semiconductor chip according to claim 7, wherein the p channel field effect transistors are connected in series and their gates are connected and the n channel field effect transistors are connected in series and their gates are connected.

9. The semiconductor chip according to claim 2, comprising a multiplicity of circuits, each circuit comprising
at least one p channel field effect transistor;
at least one n channel field effect transistor;
a first power supply terminal configured to receive the first supply voltage with the upper supply potential;
a second power supply terminal configured to receive the second supply voltage with the lower supply potential;
wherein the at least one p channel field effect transistor and the at least one n channel field effect transistor are connected such that
the at least one n channel field effect transistor, if supplied with the upper supply potential at its gate, supplies the lower supply potential to the gate of the at least one p channel field effect transistor; and
the at least one p channel field effect transistor, if supplied with the lower supply potential at its gate, supplies the upper supply potential to the gate of the at least one n channel field effect transistor;
wherein the circuit is configured such that the logic state of the gate of the at least one p channel field effect transistor and the logic state of the gate of the at least one n channel field effect transistor can only be changed by changing a supply of at least one of the first supply voltage and the second supply voltage to the circuit; and
the semiconductor chip comprises a connection coupled to the gate of the at least one p channel field effect transistor or the gate of the at least one n channel field effect transistor and a dummy gate or a metal fill structure of the semiconductor chip.

10. The semiconductor chip according to claim 2, further comprising a second circuit comprising
at least one p channel field effect transistor;
at least one n channel field effect transistor;
a first power supply terminal configured to receive the first supply voltage with the upper supply potential;
a second power supply terminal configured to receive the second supply voltage with the lower supply potential;
wherein the at least one p channel field effect transistor and the at least one n channel field effect transistor are connected such that
the at least one n channel field effect transistor, if supplied with the upper supply potential at its gate, supplies the lower supply potential to the gate of the at least one p channel field effect transistor; and
the at least one p channel field effect transistor, if supplied with the lower supply potential at its gate, supplies the upper supply potential to the gate of the at least one n channel field effect transistor;
wherein the circuit is configured such that the logic state of the gate of the at least one p channel field effect transistor and the logic state of the gate of the at least one n channel field effect transistor can only be changed by changing a supply of at least one of the first supply voltage and the second supply voltage to the circuit; and
wherein the gate of the at least one p channel field effect transistor and the gate of the at least one n channel field effect transistor are electrically isolated from any further components of the semiconductor chip.

11. The semiconductor chip according to claim 2, wherein the circuit further comprises
at least one second p channel field effect transistor;
at least one second n channel field effect transistor;
wherein the at least one second p channel field effect transistor and the at least one second n channel field effect transistor are connected such that
the at least one second n channel field effect transistor, if supplied with the upper supply potential at its gate, supplies the lower supply potential to the gate of the at least one second p channel field effect transistor; and
the at least one second p channel field effect transistor, if supplied with the lower supply potential at its gate, supplies the upper supply potential to the gate of the at least one second n channel field effect transistor;
and wherein further at least one of
the at least one second n channel field effect transistor, if supplied with the upper supply potential at its gate, supplies the lower supply potential to the gate of the at least one p channel field effect transistor; and
the at least one second p channel field effect transistor, if supplied with the lower supply potential at its gate, supplies the upper supply potential to the gate of the at least one n channel field effect transistor.

12. The semiconductor chip according to claim 11, wherein the circuit is configured such that the logic state of the gate of the at least one second p channel field effect transistor and the logic state of the gate of the at least one second n channel field effect transistor can only be changed by changing a supply of at least one of the first supply voltage and the second supply voltage to the circuit.

* * * * *